(12) United States Patent
Kriksunov et al.

(10) Patent No.: US 6,682,875 B2
(45) Date of Patent: Jan. 27, 2004

(54) METHOD AND APPARATUS FOR IMAGING WITH FIBER OPTIC ARRAYS ON NON-FLAT SURFACES

(75) Inventors: Leo B. Kriksunov, Ithaca, NY (US); Derek Harris, Woodbury, MN (US); John Mattson, St. Paul, MN (US)

(73) Assignee: BMC Industries, Inc., Minneapolis, MN (US)

( * ) Notice: Subject to any disclaimer, the term of this patent is extended or adjusted under 35 U.S.C. 154(b) by 91 days.

(21) Appl. No.: 09/883,685

(22) Filed: Jun. 18, 2001

(65) Prior Publication Data

US 2002/0192602 A1 Dec. 19, 2002

(51) Int. Cl.[7] .................................................. G03F 7/24
(52) U.S. Cl. ...................... 430/323; 430/394; 385/116; 216/8
(58) Field of Search .................. 430/323, 394, 430/322, 325; 385/116, 120; 250/493.1; 216/8

(56) References Cited

U.S. PATENT DOCUMENTS

| | | | |
|---|---|---|---|
| 4,349,817 A | 9/1982 | Hoffman et al. | 340/784 |
| 4,573,082 A | 2/1986 | Jeskey | 358/250 |
| 4,591,232 A | 5/1986 | Jeskey | 350/96.27 |
| 5,095,202 A | 3/1992 | Watase et al. | 250/213 |
| 5,181,130 A | 1/1993 | Hubby, Jr. | 359/42 |
| 5,741,429 A | 4/1998 | Donadio, III et al. | 216/8 |
| 5,817,243 A | 10/1998 | Shaffer | 216/65 |
| 5,898,706 A | 4/1999 | Dufresne et al. | 371/28 |
| 6,019,784 A | 2/2000 | Hines | 623/1 |
| 6,027,863 A | 2/2000 | Donadio, III | 430/320 |
| 6,086,773 A | 7/2000 | Dufresne et al. | 216/8 |
| 6,107,004 A | 8/2000 | Donadio, III | 430/320 |

FOREIGN PATENT DOCUMENTS

| | | | |
|---|---|---|---|
| EP | 0 122 829 A2 | | 10/1984 |
| GB | 2 150 312 A | * | 6/1985 |

* cited by examiner

*Primary Examiner*—John A. McPherson
(74) *Attorney, Agent, or Firm*—Mark A. Litman & Assoc. P.A.

(57) ABSTRACT

A photoresist etching process and system can be used for the etching of non-planar or three-dimensional surfaces by using a non-planar shaped fiber optic array or fiber optic panel. The array or panel has a contour or shape that may nest a non-planar or three-dimensional article or surface. The non-planar or three-dimensional article or surface has a photoresist composition on its surface facing the optical fibers of the fiber optic array or panel, and the article or surface is nested against the contour or shape of the array or panel. Radiation is transported through the optical fibers and exposes the photoresist composition. The optical fiber array may perform an image-wise exposure of the photoresist composition by appropriate blockage of the radiation before it enters or as it enters a distal end of the optical fibers. In this manner, an image-wise distribution of radiation is presented against the photoresist composition, and an image-wise developable resist pattern is created on the non-planar or three-dimensional article or surface. This process can be used on cylinders, tubes, spheres, undulating surfaces, blocks, wavy surfaces, stepped surfaces, and any other shape that can be standardized or formatted into a nesting shape.

19 Claims, 7 Drawing Sheets

METHOD AND APPARATUS FOR IMAGING WITH FIBER OPTIC ARRAYS ON NON-FLAT SURFACES

BACKGROUND OF THE INVENTION

1. Field of the Invention

The present invention relates to the field of etching, the field of photolithographic etching, the photolithographic etching of non-planar surfaces, and photolithographic etching using fiber optic arrays to direct imaging radiation against a photoresist surface.

2. Background of the Art

Etching is a process with a long history that has developed utilities in a wide array of different technologies. Even chiseling is a mechanical form of etching, used thousands of years ago to put writing and glyphs into stone. The use of stencils to apply inks or paints was the next progression towards the modem format for sophisticated etching known as photoresist or photolithographic etching. In the photolithographic format of etching, a photoresist composition is place over a surface onto which or into which an etched pattern is to be introduced. The photoresist composition has two primary functional properties. It forms a film that can be subjected to radiation (e.g., X-ray, UV, visible, near infrared, or infrared radiation) that will alter the solubility or areas where sufficient radiation is absorbed. The alteration in solubility will be either an increase in solubility where radiation is absorbed (a positive-acting photoresist system) or a decrease in solubility where radiation is absorbed (a negative-acting photoresist system). After an appropriate amount of radiation in an image-wise distribution or pattern, the irradiated photosensitive film is washed or developed in a solvent that can differentiated between the different levels of solubility created in the photoresist film by the irradiation. Usually the developing of wash-off solution (referred to as the developer) is preferably an aqueous solution (e.g., a water-based alkaline solution, or aqueous solution with small amounts of alcohol, such as n-butanol), although organic solvent solutions may also be used. The developer or wash-off solution or liquid (as pure water wash-off systems have been prepared) removes regions of the photoresist composition that are relatively more soluble than the other regions (that have been irradiated in a negative acting system or which have not been irradiated in a positive acting system). The removal or the image-wise distribution of photoresist composition leaves a pattern or image of photoresist material that must now display its second fundamental property.

The remaining photoresist composition must resist the solubilizing activity or etching activity of an etchant solution that is used to etch features into the surface. This etchant solution may be relatively stronger and is usually fundamentally different than the nature of the developer solution (e.g., the tech solution may be strongly acidic, contain chelating agents, may be at elevated temperatures, may be water-based or organic solvent based, and may be a complex mixture of many ingredients). The photoresist composition must be able to endure the effects of the etchant solution at least as long as is necessary to enable the degree of etching of the substrate surface as is desired by the operator. These properties are not easily obtained, and much effort has been put into developing photoresist compositions that can perform these and other functions, and provide sufficient resolution (e.g., etch lines of as little as 1 micrometer and less) to enable use of the technology in the manufacture of sophisticated devices such as stents, catheters, microcoils, circuit boards, circuits, chips, light control films, medical devices, and the like.

The photolithographic process can be highly economical with regard to large volume production of elements and devices with extremely detailed surface structures or holes required. However, the capitol investment in equipment and the skill of the operators is likely to be commensurately high with the precision required in the article and the process.

The exposure methods for such systems usually involve the application of high resolution masks over the photoresist compositions, the use of laser imaging systems, the use of printing compositions for the application of masks, and other relatively high resolution imaging systems.

U.S. Pat. No. 5,181,130 describes a novel liquid crystal display which includes a layer of liquid crystal material, a thin transparent layer, one or more polarizers, and a fiber optic faceplate. The fiber optic faceplate serves to allow ambient light from a much wider range of incident angles to illuminate the LCD than would be the case with prior art LCDs, and allows the viewer to position himself so as to avoid front surface glare and still see the display brightly illuminated, even in difficult lighting situations. Hoffman et al. were one of the first to couple fiber optic panels with Liquid Crystal Diodes (LCDs) as shown in U.S. Pat. No. 4,349,817. U.S. Pat. No. 5,181,130 asserted that application of the teachings of Hoffman et al. would not improve, and in fact would seriously degrade, the contrast of LCD displays for two reasons. First, eliminating light which strikes the display at angles to the display surface normal greater than the viewing angle of the display will not enhance the contrast because displays depend upon the action of polarizers on polarized light propagating within the display rather than scattering to produce the light and dark areas of their images. Second, introduction of a fiber plate, as taught by Hoffman et al., in near-contact with the liquid crystal layer itself will seriously reduce the image contrast because light passing through such a fiber plate is strongly depolarized, thus largely destroying the distinction between the light and dark areas of the image.

U.S. Pat. No. 5.095,202 teaches that a proximity image intensifier for intensifying an optical image may comprise:

a faceplate having a surface for receiving the optical image and another surface; a photocathode fixed to the another surface of said faceplate for photoelectrically converting the optical image and producing photoelectrons; a fiberplate having a surface closely disposed in confrontation with said photocathode; a phosphor screen fixed to the surface of said fiberplate for receiving the photoelectrons from said photocathode and producing an intensified optical image thereon; a high-voltage power supply for applying a high voltage necessary for accelerating the photoelectrons moving toward said phosphor screen; a power supply path connected between said photocathode and said high-voltage power supply and between said phosphor screen and said high-voltage power supply for connecting said high-voltage power supply across said photocathode and said phosphor screen; and a resistor interposed in said power supply path at a position immediately before at least one of said photocathode and said phosphor screen for suppressing an excessive photoelectric current which may flow between said photocathode and said phosphor screen when highly intensive light is locally incident on the surface of said faceplate.

U.S. Pat. No. 6,019,784 describes an expandable stent useful for implantation into an artery or the like. The stents are made using electroforming techniques in which an electrically-conductive mandrel is coated with a suitable resist material, after which the resist is exposed to an appropriate light pattern and frequency so as to form a stent pattern in the resist. The mandrel is then electroplated with a suitable stent material. The mandrel is etched away once a sufficient layer of stent material is deposited, leaving a completed stent. The preferred exposure system of one embodiment comprises a controller, which may be a computer or similar device, operably connected to light emitting diodes (LEDs) that are coupled to optic fibers. The optic fibers are routed to a mounting fixture. The optic fibers and future together form an exposure ring which surrounds the mandrel. The optic fibers are used to direct light to the resist coating on the surface of the mandrel and thereby create a stent pattern in the resist.

U.S. Pat. No. 6,086,773 describes a process for the manufacture of flexible tubular elements, particularly stents for the medical field, the process comprising the steps of: a) providing a hollow metal tube (or metal coated tube) with an open pattern of a chemical-etch-resistant coating layer; b) supporting the hollow metal tube with a coating thereon onto a chemical etch resistant support element; c) contacting the open pattern with a solution capable of etching the metal of the hollow metal tube so that said metal is etched away from physically exposed surfaces of the metal tube and openings in the metal tube corresponding to the open pattern of the coating layer are created in the metal tube element without etching the chemical etch resistant support element; and d) removing the metal tube from the chemical etch resistant support element. U.S. Pat. Nos. 6,107,004; 6,027,863; 5,898,706; 5,817,243; and 5,741,429 also show alternative methods for photoexposing resist materials and subsequent etching of surfaces through pattern residues of resist materials.

Prior art in fiberoptic (FO) faceplates involve placing them onto display devices for the purpose of optical coupling the display screen to an optical system, or using them in high brightness direct view displays. CRTs have been manufactured with fiberoptic plates, which focuses and relays the image from the CRT to a light valve or large screen projection system. U.S. Pat. No. 4,591,232 of Jeskey disclosed fiberoptic CRT faceplates that have light absorbing black fibers dispersed throughout the bundle to reduce "halation" or "ballooning" of the image. U.S. Pat. No. 4,573,082 of Jeskey disclosed a similar CRT fiberoptic faceplate for optical transfer of an enhanced image to a projection screen. In addition, European Patent 0122829 of Rover et. al. disclosed a fiberplate to act as an optical filter in order to provide optimum visibility of a display device under a variety of ambient viewing conditions. The primary shortcoming of these prior art display devices is that they do not disclose or anticipate pen/stylus input means integrated with a display. This puts such display devices at a severe disadvantage in the highly interactive computer, display, and PDA markets.

The majority of photoresist systems are used in the manufacture or treatment of two dimensional objects (such as printing plates or etched flat surfaces). Although some systems, as described above, are designed for the etching of three-dimensional articles, these systems can be relatively expensive and capital-intensive and labor intensive. It would be desirable to provide a photoresist etch system that can be used with facility in the rapid manufacture of three-dimensional objects, without large capital investment and without the need for sophisticated training techniques and highly skilled technicians.

SUMMARY OF THE INVENTION

A photoresist etching process and system that can be used for the etching of non-planar or three-dimensional surfaces comprises a non-planar shaped fiber optic array or fiber optic panel. The array or panel has a contour or shape that may nest a non-planar or three-dimensional article or surface. The non-planar or three-dimensional article or surface has a photoresist composition on its surface facing the optical fibers of the fiber optic array or panel, and the article or surface is nested against the contour or shape of the array or panel. Radiation is transported through the optical fibers and exposes the photoresist composition. The optical fiber array may perform an image-wise exposure of the photoresist composition by appropriate blockage of the radiation before it enters or as it enters a distal end of the optical fibers. In this manner, an image-wise distribution of radiation is presented against the photoresist composition, and an image-wise developable resist pattern is created on the non-planar or three-dimensional article or surface. This process can be used on cylinders, tubes, spheres, undulating surfaces, blocks, wavy surfaces, stepped surfaces, and any other shape that can be standardized or formatted into a nesting shape.

DETAILED DESCRIPTION OF THE INVENTION

Fiber optic arrays or fiber optic panels or fiberplates are well known in various technical fields. They usually comprise arrays or stacks of parallel optical fibers. The fibers form a surface with an array of optically (light-emitting) open fiber optic ends. Light is introduced into a distal end of each fiber (by individual optical connections or by exposure of the distal ends of the optical fibers by a blanket exposure of all optical fibers). The light is transmitted through the optical fibers and out of the optical fiber ends at the proximal surface of the fiber optic array. These arrays or panels are usually provided as a rectangular cross-section and as a box-like structure with three pairs of parallel opposed surfaces, with only two surfaces having the optical fiber ends available thereon.

Photoresist compositions, both as solid film resists or coatable liquid resists, are well know in both negative-acting and positive-acting formats. The specific natures of these compositions are well recognized in various arts as being able to contribute to the degree of resolution available from the photoresist or photolithographic etch processes in which they are used. In the practice of the present invention, no particular resist compositions are preferred with respect to other compositions. The specific substrates, surfaces, etch features, and resolutions will assist the ordinarily skilled artisan to select appropriate resist compositions based upon traditional considerations and factors.

Reference to the Figures will assist in a better appreciation and understanding of the practice and details of the invention.

Figure 1A:
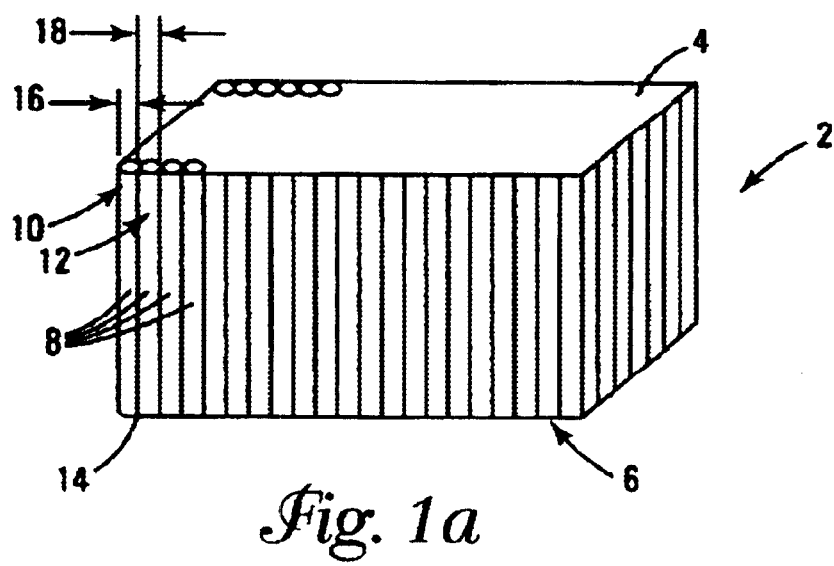
FIG. 1a) shows a perspective view of a fiber optic panel or fiberplate.

FIG. 1a) shows a perspective view of a fiber optic panel 2 or fiberplate. The fiber optic panel 2 comprises a proximal surface 4 and a distal surface 6 with rows of optical fibers 8 optically connecting the two surfaces (4, 6). Two adjacent optical fibers 10, 12 are shown, with the limits in optical resolution for the fibers being determined by the combined fiber wall thickness 14 and the diameters 16, 18 of the adjacent fibers 10, 12.

Figure 1B:
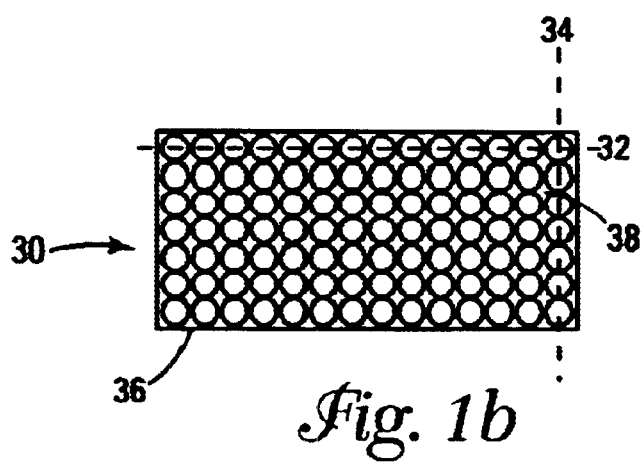
FIG. 1b) shows a top view of a stacked fiber optic array in a fiber optic panel.

FIG. 1b) shows a top view of a stacked fiber optic array 30 in a fiber optic panel 36. In this format, all rows 32 are parallel and all columns 34 are parallel, Inter-fiber voids 38 are maximized by this format, but a very clear pixelizing distribution is provided because of the symmetry of the rows 32 and columns 34.

Figure 1C:
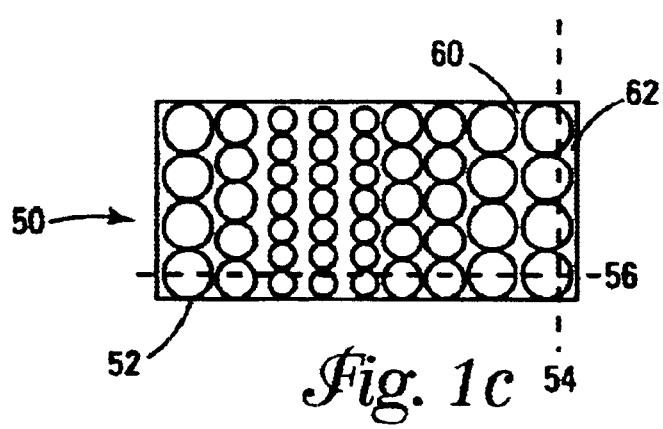
FIG. 1c) shows a top view of a staggered fiber optic array in a fiber optic panel.

FIG. 1c) shows a top view of a staggered fiber optic array 50 in a fiber optic panel 52. Although all columns 52 and rows 52 are parallel, the packing of the columns 52 is shown to minimize inter-fiber voids 60 within the body of the array, while voids are more prominent at the edges 62 of the fiber optic panel 52. This distribution can increase resolution slightly over the stacked array 30 of FIG. 1b).

Figure 2:
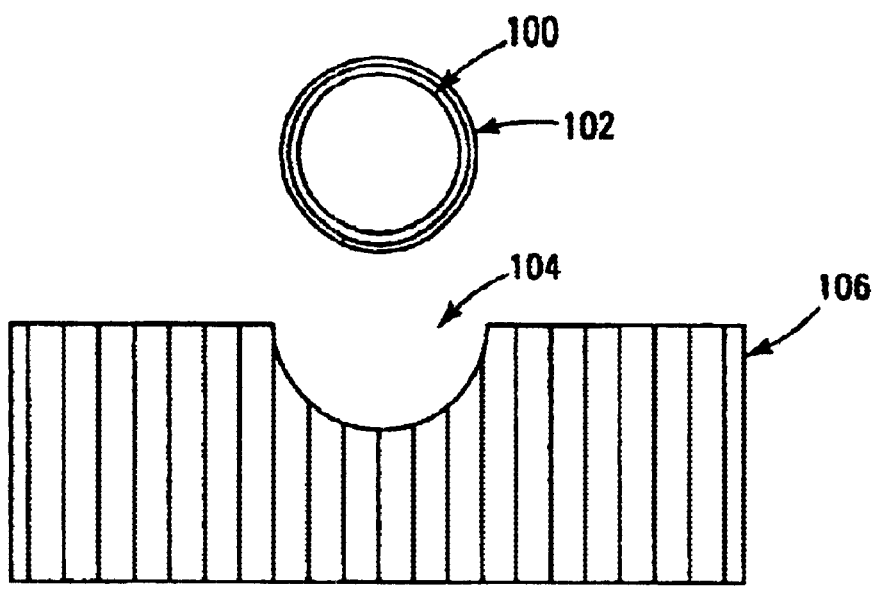
FIG. 2 shows a side cutaway view of a tube coated with photoresist positioned above a nestable recess in a fiber optic panel.

FIG. 2 shows a side cutaway view of a tube 100 coated with photoresist composition 102 positioned above a nestable recess 104 in a fiber optic panel 106.

Figure 3:
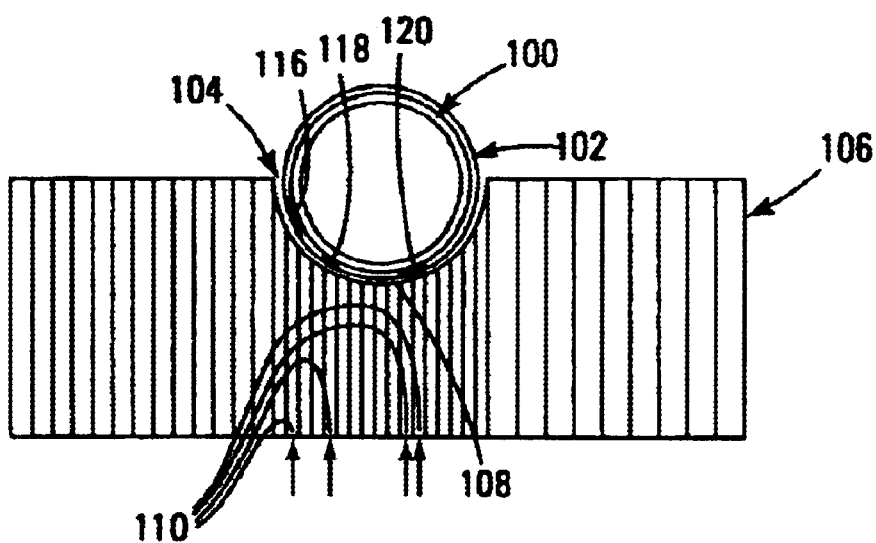
FIG. 3 shows a side cutaway view of a tube coated with photoresist positioned in a nestable recess in a fiber optic panel, with radiation entering some optical fibers to expose only some areas of the photoresist composition on a surface of the tube.

FIG. 3 shows a side cutaway view of a tube 100 coated with a photoresist composition 102 positioned in a nestable recess 104 in a fiber optic panel 106, with radiation 108 entering some optical fibers (all uncolored 110) to expose only some areas (116, 118 and 120) of the photoresist composition 102 on a surface of the tube 100. The exposed areas (116, 118 and 120) would be hardened (insolubilized) in a negative-acting system and softened (solubilized) in a positive-acting system.

Figure 4:
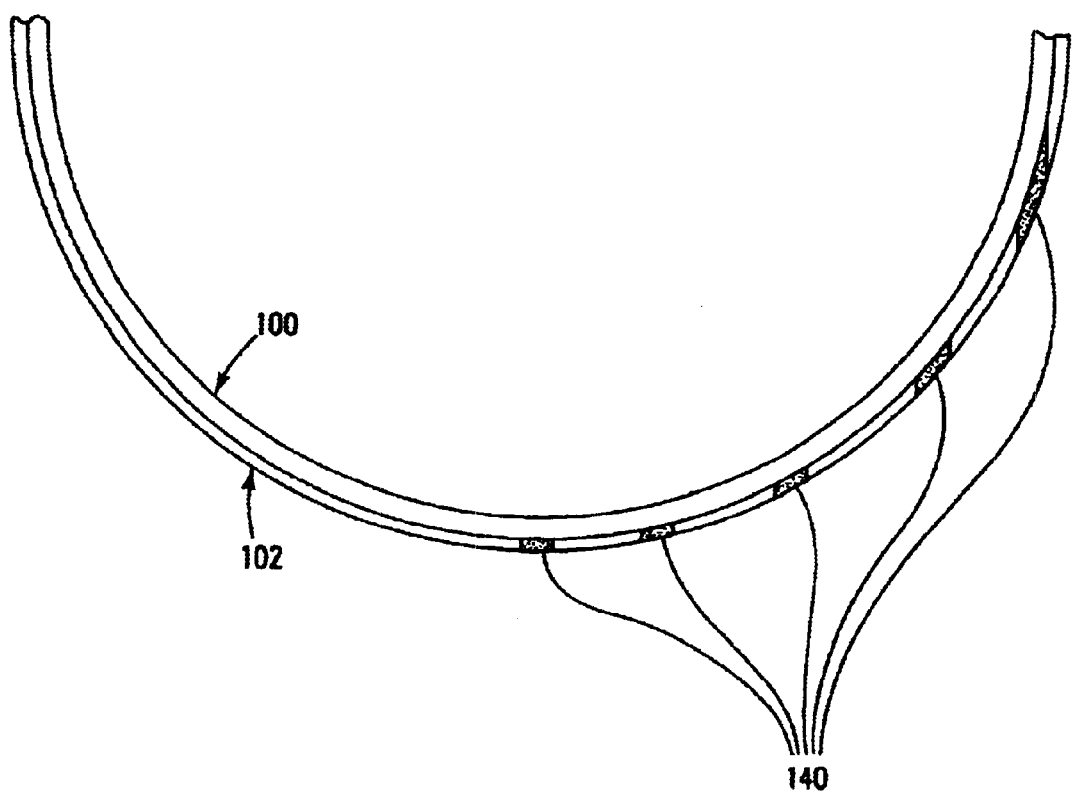
FIG. 4 shows a side cutaway view of an exposed and developed tube with photoresist composition thereon, the view showing angular disparities in the developed spots of the photoresist composition.

FIG. 4 shows a side cutaway view of an exposed and developed tube 100 with photoresist composition 102 thereon, the view showing angular disparities in the developed spots 140 of the photoresist composition 102.

Figure 5A:
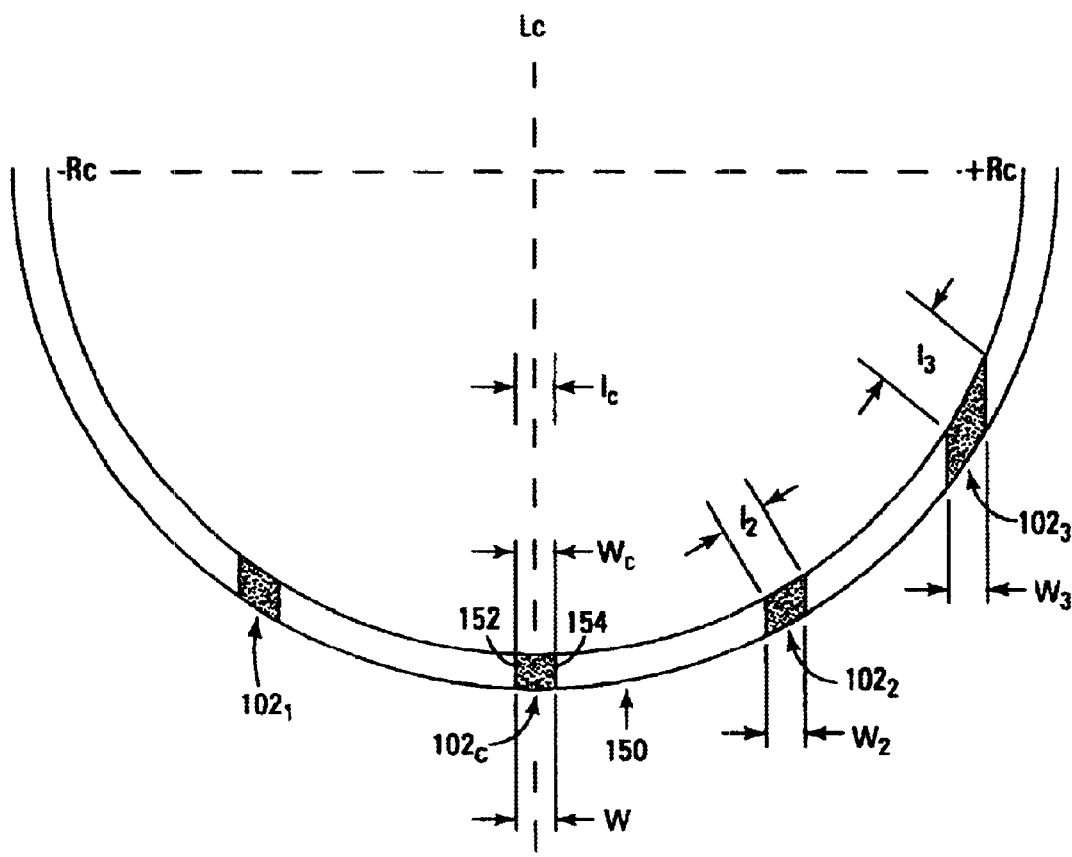
FIG. 5a) shows a side cutaway view of an exposed and developed tube with photoresist composition thereon, the view emphasizing angular disparities in the developed spots of the photoresist composition.

FIG. 5a) shows a side cutaway view of an exposed and developed tube 100 with photoresist composition 102 thereon, the view emphasizing angular disparities in the developed spots $102_c$, $102_1$, $102_2$, $102_3$, of the photoresist composition. The centermost spot, $102_c$, having been exposed by a centrally located (with regard to a geometric center of the tube 100) optical fiber that was perpendicularly aligned with regard to the surface 150 of the tube 100, has its sides 152 and 154 perpendicular to the surface 150 of the tube 100. If line $L_c$, represent the center line of the nesting region in a fiber optic array and $R_c$, represent a distance along the surface of the fiber optic array that an optical fiber is removed from the center line $L_c$, it is clear that the greater the absolute value of $R_c$, the less perpendicular sides of spots $102_1$, $102_2$, $102_3$ are with respect to the surface 150 of the tube 100. Tis has a distinct effect on the shape of the spots $102_1$, $102_2$, $102_3$ and the resolution of the system. As can be seen in the center spot $102_{1c}$, the width of the exposure w, is essentially identical to the width of the vertically viewed spot $w_{1c}$, and the length $l_c$ of the spot $102_c$. However, as $R_c$ increases, if the width of the exposure w, is constant, each l becomes increasing greater than its corresponding w. As shown in the figures, if each w remains constant, with increasing $R_c$, l becomes increasingly larger than w. So that $l_c-w_c<l_1-w_1<l_2-w_2$ and $<l_3-w_3$. This means that resolution tends to deteriorate when measured at points or spots increasingly farther away from the center line $L_c$.

Figure 5B:
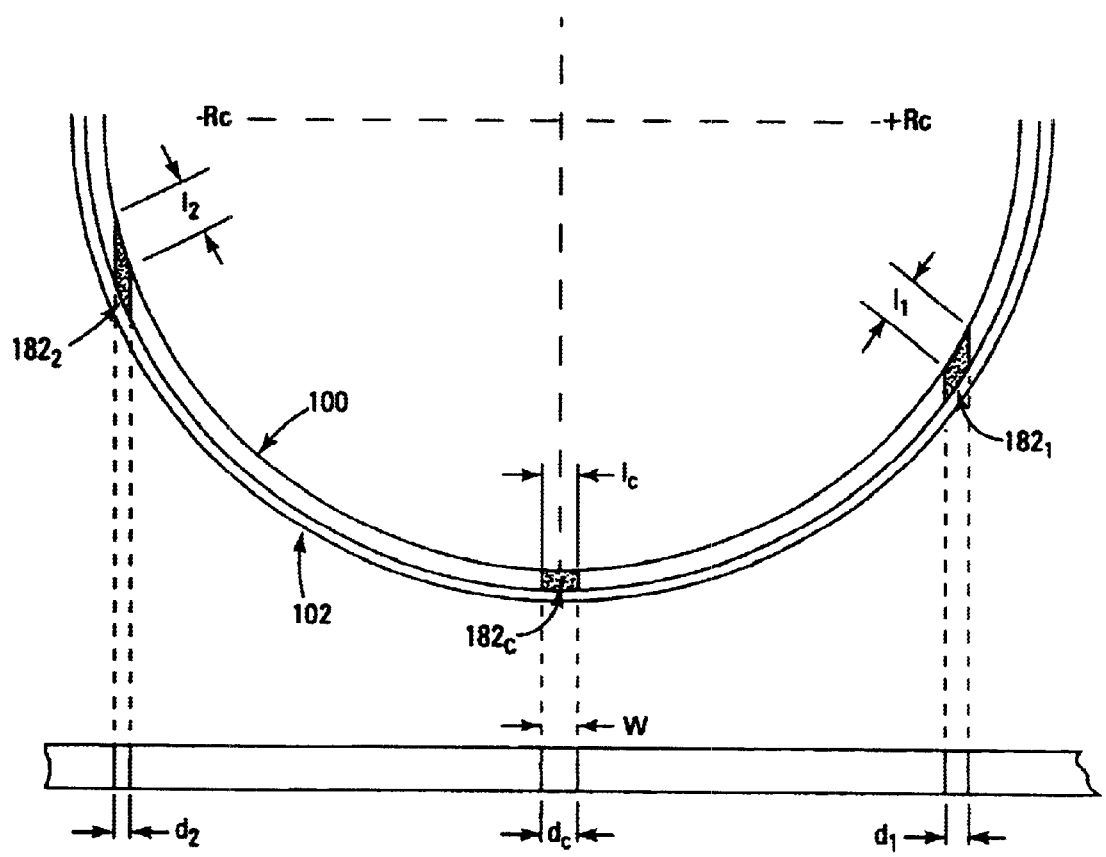
FIG. 5b) shows a side cutaway view of an exposed and developed tube with photoresist composition thereon, the view showing a methodology for reducing angular disparities in the developed spots of the photoresist composition.

FIG. 5b) shows a side cutaway view of an exposed and developed tube 100 with residual photoresist composition 102 thereon, the view showing a methodology for reducing angular disparities in the developed spots $182_c$, $182_1$, and $182_2$. By having the distal diameters $d_c$, $d_1$, and $d_2$ of optical fibers provided with decreasing diameters as $R_c$ increases, the angular distortion displayed in FIG. 5a) is reduced. This is effected because the width of the exposure w no longer remains constant. Even though the ratio of l/w continues to increase with increasing $R_c$, the design decrease for w assures that l can remain constant or at least increase at a relatively slower rate with regard to increasing $R_c$.

The taper, nesting shape or contour of the optical fiber array may be produced by machining (e.g., mechanical machining, grinding, etc.), chemical machining (e.g., etching), electromechanical machining (electrical discharge machining), laser etching, sputter etching, and the like. Alternatively, the faceplate (fiber optic array) can have its surface replicated by forming the faceplate (orienting the fibers before being secured into a plate) against a form shape. For example, the thin optical fiber conduits may terminate on a 3D shape resembling the shape of the object to be imaged, and then the fibers may be bonded, side-by-side.

There are numerous advantages of the process of the invention that can be readily observed. The fibers are transmitting the artwork image with high resolution to the surface of the imaged object. This enables to image curved or other non-flat surfaces with 6 micron resolution fiber assemblies that are easily available. Smaller (finer) resolution fiber optic arrays can be specifically designed for this process. The imaging might be performed several times, with precise rotation of an imaged object. This would further reduced the angularity effects described above. For example, in an ideal system, there might be only a single rotation, with a hemisphere of the tube satisfactorily imaged and developed with a single exposure/development step. It is more likely that at least three, at least four, at least five or at least six exposure development steps might be used (with the same or consecutive or series nesting areas). This would assist in the reduction of angularity effects and/or decrease the cost of having the highest resolution optical fibers and nesting patterns.

Among some of the advantages of the practice of the invention are also at least the high speed of imaging, high precision, the ability to etch complex shapes from the outside and inside of hollow structures, and an inexpensive process. Among the disadvantages of prior art processes are at least a) Laser imaging problems include slow speeds for etching, requires high precision x-y tables, special resist, and is expensive, especially for high volume work. The use of flexible artwork on plastic substrates, conforming the artwork to the surface profile which is being imaged suffers from insufficient precision.

The first attempt at practicing the process of the invention was verified experimentally by imaging and etching 100 micron dots and larger slots on a 5 mm diameter rod. Based on that test, the principal feasibility of this method has been confirmed and reduced to practice.

Figure 6:
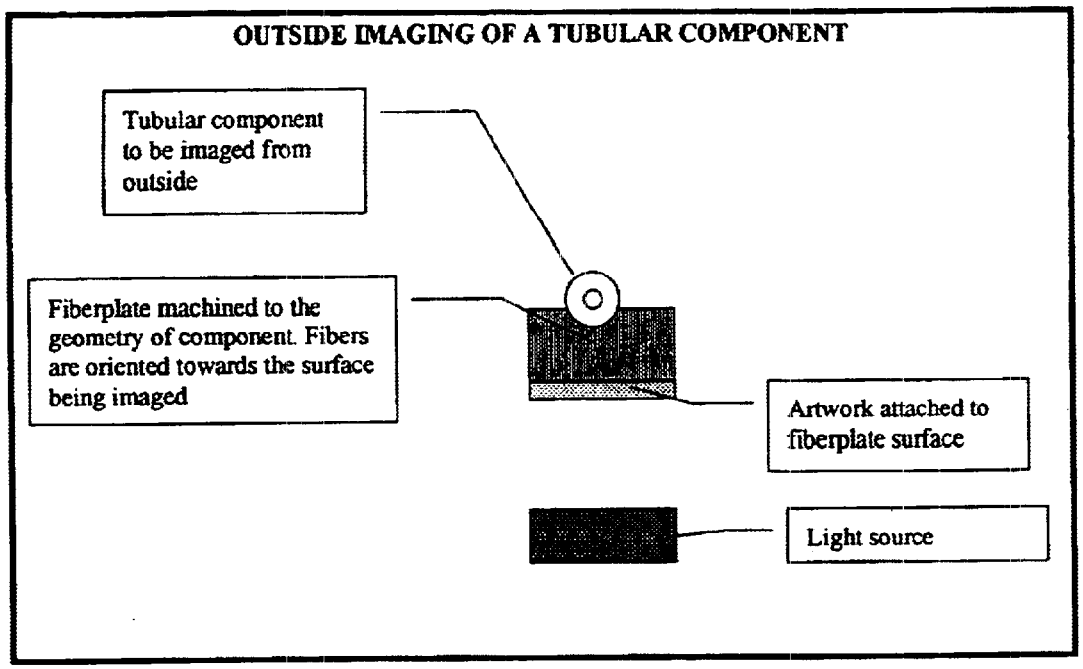
FIG. 6 shows the orientation of a light source, art work, optic fiber array, and tubular component to be imaged.

FIG. 6 shows the orientation of a light source, art work, optical fiber array and tubular component to be imaged from the outside. The components are provided in the order of the light source, the artwork (attached to a first fiber plate surface, a second surface of the fiberplate having machined geometry and the tubular component to be imaged from the outside.

Figure 7:
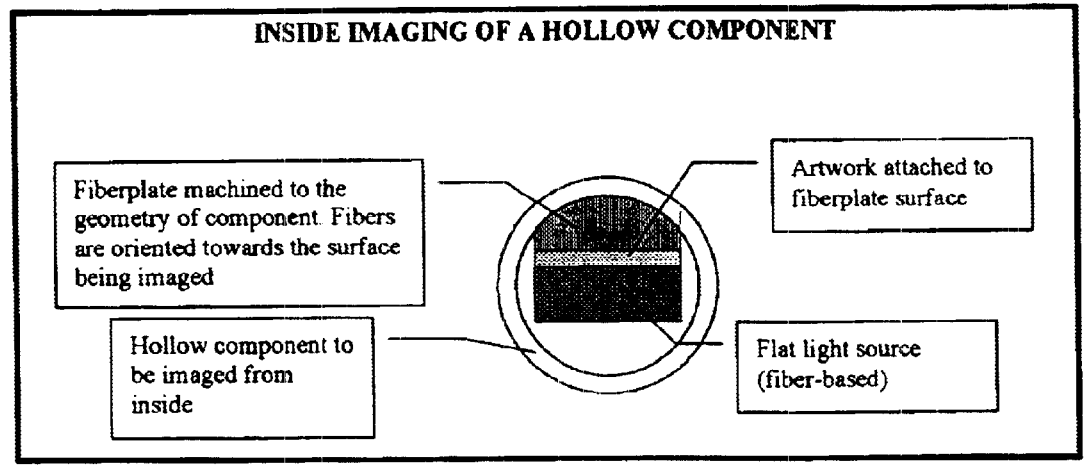
FIG. 7 shows the orientation of a fiber-based light source, art work, fiber optic array and tube to be etched from internal exposure, within the core of the tube.

FIG. 7 shows imaging of a hollow component from the inside. The components are provided in the order (from the inside to the outside) of a flat light source, artwork attached to a first fiberplate surface, a fiberplate machined to the geometry of a component, and the hollow component to be imaged from inside.

Figure 8:
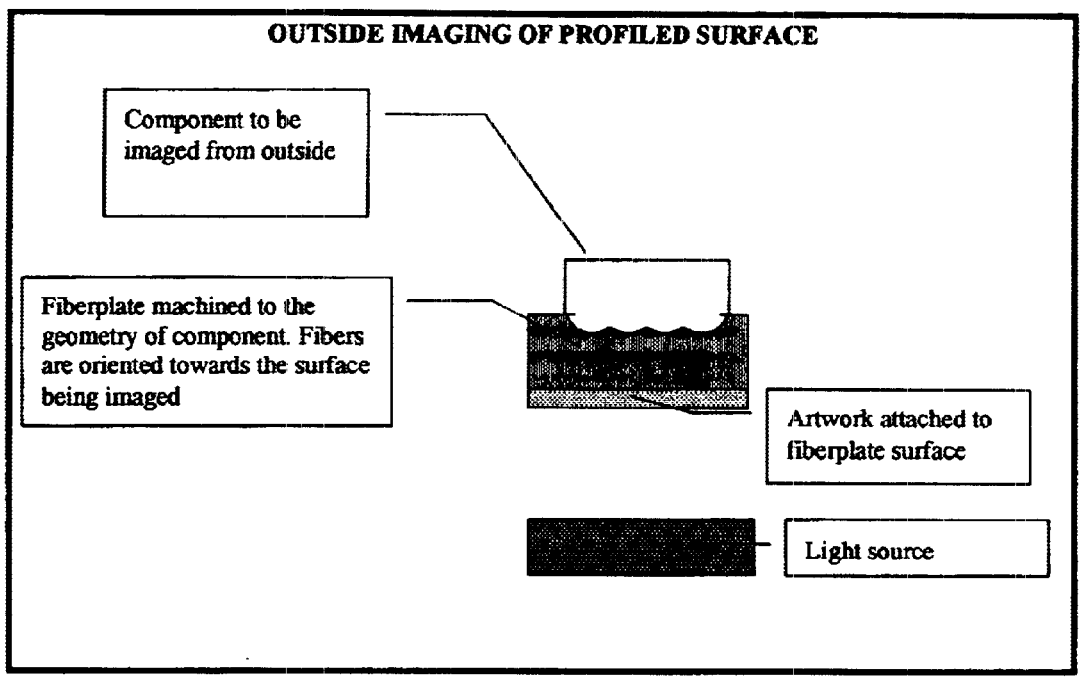
FIG. 8 shows the external imaging of a profiled surface, as opposed to a cylindrical or tubular surface.

FIG. 8 shows the outside imaging of a profiled surface. The components are provided in the order of a light source, artwork attached to a first fiberplate surface, a second fiberplate surface etched to the geometry of a component, and the component to be etched from the outside.

What is claimed:

1. A process for etching a non-planer surface comprising:
   forming a concave nesting contour on a fiber optic array having a distal optical fiber surface and a proximal optical fiber surface, the concave nesting contour being present on the proximal fiber optic surface;
   nesting a surface of a convex non-planar article selected from the group consisting of cylinders, tubes, spheres and blocks against the nesting contour, the surface of the non-planar article having a photoresist composition thereon;
   providing radiation that is effective in altering solubility properties of the photoresist composition to the distal optical fiber surface;
   exposing in a first exposing step photoresist composition optically connected to the proximal optical fiber surface within the concave nesting contour in less than all areas of the photoresist composition within the concave nesting contour;
   developing the photoresist composition to remove photoresist composition corresponding to segments related to areas of photoresist that were exposed or not exposed to said radiation to form non-continuous areas on the convex non-planar article that are coated with photoresist composition; and
   contacting an etch solution for material of the convex non-planar article that will etch the material of the article more rapidly than it will dissolve the photoresist composition on the surface of the article.

2. The process of claim 1 wherein the photoresist material is coated on an exterior surface of the convex non-planar article and after exposing photoresist composition connected to the proximal optical fiber surface within the concave nesting contour, rotating the convex non-planar article to expose photoresist composition that was not exposed in the first exposing step.

3. The process of claim 2 wherein the convex non-planar article comprises a cylindrical article.

4. The process of claim 3 wherein the cylindrical article comprises a hollow tube.

5. The method of claim 3 wherein the convex non-planar article is rotated at least two times to expose photoresist composition that was not exposed in a preceding exposing step.

6. The method of claim 2 wherein the convex non-planar article is rotated at least two times to expose photoresist composition that was not exposed in a preceding exposing step.

7. The process of claim 1 wherein the photoresist material is coated on an interior surface of the convex non-planar article, with the convex non-planar article being hollow.

8. A process for etching a non-planer surface of a cylindrical article comprising a hollow tube, the process comprising:
   forming a concave nesting contour on a fiber optic array having a distal optical fiber surface and a proximal optical fiber surface, the concave nesting contour being present on the proximal fiber optic surface;
   nesting a surface of a convex non-planar article against the nesting contour, the surface of the non-planar article having a photoresist composition thereon;
   providing radiation that is effective in altering solubility properties of the photoresist composition to the distal optical fiber surface;
   exposing in a first exposing step photoresist composition optically connected to the proximal optical fiber surface within the concave nesting contour in less than all areas of the photoresist composition within the concave nesting contour;
   developing the photoresist composition to remove photoresist composition corresponding to segments related to areas of photoresist that were exposed or not exposed to said radiation to form non-continuous areas on the convex non-planar article that are coated with photoresist composition; and
   contacting an etch solution for material of the convex non-planar article that will etch the material of the article more rapidly than it will dissolve the photoresist composition on the surface of the article wherein the photoresist material on the hollow tube is exposed in different areas of the photoresist material at least three separate times when nested against a nesting contour on a fiber optic array having a distal optical fiber surface and a proximal optical fiber surface.

9. The process of claim 8 wherein the hollow tube has a circular or oval cross section.

10. The process of claim 9 wherein a pattern of different size optical fibers is present within the nesting contour to reduce angularity effects on exposure of photoresist material.

11. A system for exposure of a photolithographically etchable convex non-planar article comprising a fiber optic array having a concave nesting contour, the fiber optic array having a distal optical fiber surface and a proximal optical fiber surface, the concave nesting contour being present on the proximal fiber optic surface;

a surface of a convex non-planar article selected from the group consisting of a cylinder, tube, sphere or block nested against the concave nesting contour, the surface of the convex non-planar article having a photoresist composition thereon;

a radiation source that can emit radiation that is effective in altering solubility properties of the photoresist composition to the distal optical fiber surface;

the photoresist composition being optically connected to the proximal optical fiber surface.

12. The system of claim 11 wherein the photoresist material is coated on an exterior surface of the convex non-planar article.

13. The system of claim 11 wherein the photoresist material is coated on an interior surface of the convex non-planar article, with the convex non-planar article being hollow and transparent to the radiation that is effective in altering solubility properties.

14. The system of claim 13 wherein the convex non-planar article comprises a cylindrical article.

15. The system of claim 14 wherein the cylindrical article comprises a hollow tube.

16. The system of claim 15 wherein the hollow tube has a circular or oval cross-section.

17. A system for exposure of a photolithographically etchable convex non-planar article comprising a fiber optic array having a concave nesting contour, the fiber optic array having a distal optical fiber surface and a proximal optical fiber surface, the concave nesting contour being present on the proximal fiber optic surface;

a surface of a convex non-planar article nested against the concave nesting contour, the surface of the convex non-planar article having a photoresist composition thereon;

a radiation source that can emit radiation that is effective in altering solubility properties of the photoresist composition to the distal optical fiber surface;

the photoresist composition being optically connected to the proximal optical fiber surface the photoresist material is coated on an interior surface of the convex non-planar article, with the convex non-planar article being hollow and transparent to the radiation that is effective in altering solubility properties, wherein the convex non-planar article comprises a cylindrical article, wherein the cylindrical article comprises a hollow tube; and wherein the photoresist material on the hollow tube is exposed in different areas of the photoresist material at least three separate times when nested against a concave nesting contour on a fiber optic array having a distal optical fiber surface and a proximal optical fiber surface.

18. The system of claim 17 wherein the hollow tube has a circular or oval cross-section.

19. The system of claim 18 wherein a pattern of different size optical fibers is present within the concave nesting contour to reduce angularity effects on exposure of photoresist material.

* * * * *